(12) United States Patent
Chanemougame et al.

(10) Patent No.: US 11,581,242 B2
(45) Date of Patent: Feb. 14, 2023

(54) INTEGRATED HIGH EFFICIENCY GATE ON GATE COOLING

(71) Applicant: Tokyo Electron Limited, Tokyo (JP)

(72) Inventors: Daniel Chanemougame, Niskayuna, NY (US); Lars Liebmann, Mechanicsville, NY (US); Jeffrey Smith, Clifton Park, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/344,259

(22) Filed: Jun. 10, 2021

(65) Prior Publication Data

US 2022/0223497 A1    Jul. 14, 2022

Related U.S. Application Data

(60) Provisional application No. 63/137,441, filed on Jan. 14, 2021.

(51) Int. Cl.
*H01L 23/473* (2006.01)
*H01L 25/00* (2006.01)
*H01L 25/065* (2023.01)
*H01L 23/00* (2006.01)
*H01L 25/18* (2023.01)

(52) U.S. Cl.
CPC ............ *H01L 23/473* (2013.01); *H01L 24/83* (2013.01); *H01L 25/0657* (2013.01); *H01L 25/18* (2013.01); *H01L 25/50* (2013.01); *H01L 2224/83909* (2013.01); *H01L 2225/06565* (2013.01); *H01L 2225/06589* (2013.01)

(58) Field of Classification Search
CPC .................................................... H01L 23/473
See application file for complete search history.

(56) References Cited

U.S. PATENT DOCUMENTS

| | | | |
|---|---|---|---|
| 1,171,075 A | 2/1916 | Taylor | |
| 7,936,563 B2 | 5/2011 | Gosset et al. | |
| 8,080,866 B2 | 12/2011 | Werner et al. | |
| 8,198,174 B2 | 6/2012 | Hsu et al. | |
| 9,318,468 B2 | 4/2016 | Werner et al. | |
| 9,410,893 B2 * | 8/2016 | Lai | B01L 3/502707 |
| 10,014,279 B2 | 7/2018 | Werner et al. | |
| 10,121,729 B2 | 11/2018 | Dede et al. | |

(Continued)

OTHER PUBLICATIONS

International Search Report and Written Opinion dated Mar. 10, 2022 in PCT/US2021/059550, 11 pages.

*Primary Examiner* — Thao P Le
(74) *Attorney, Agent, or Firm* — Oblon, McClelland, Maier & Neustadt, L.L.P.

(57) ABSTRACT

A microfabrication device is provided. The microfabrication device includes a combined substrate including a first substrate connected to a second substrate, the first substrate having first devices and the second substrate having second devices; fluidic passages formed at a connection point between the first substrate and the second substrate, the connection point including a wiring structure that electrically connects first devices to second devices and physically connects the first substrate to the second substrate; dielectric fluid added to the fluidic passages; and a circulating mechanism configured to circulate the dielectric fluid through the fluidic passages to transfer heat.

14 Claims, 9 Drawing Sheets

(56) References Cited

U.S. PATENT DOCUMENTS

| | | | |
|---|---|---|---|
| 2008/0266787 A1 | 10/2008 | Gosset et al. | |
| 2010/0052134 A1 | 3/2010 | Werner et al. | |
| 2011/0031633 A1 | 2/2011 | Hsu et al. | |
| 2012/0061818 A1 | 3/2012 | Werner et al. | |
| 2016/0190104 A1 | 6/2016 | Werner et al. | |
| 2016/0299101 A1* | 10/2016 | Pantoja | B01L 3/502715 |
| 2017/0105313 A1* | 4/2017 | Shedd | H05K 7/20809 |
| 2018/0025962 A1 | 1/2018 | Dede et al. | |
| 2018/0353970 A1* | 12/2018 | Bai | B03C 5/026 |
| 2020/0013699 A1 | 1/2020 | Liu et al. | |
| 2021/0129141 A1* | 5/2021 | Sadabadi | B01L 3/502715 |
| 2021/0241997 A1* | 8/2021 | Lee | H01J 37/32449 |
| 2022/0131210 A1* | 4/2022 | Botadra | H01M 50/291 |
| 2022/0158307 A1* | 5/2022 | Frick | H01M 50/213 |
| 2022/0190452 A1* | 6/2022 | Botadra | H01M 50/583 |
| 2022/0234108 A1* | 7/2022 | Antesberger | B29C 48/32 |

\* cited by examiner

INTEGRATED HIGH EFFICIENCY GATE ON GATE COOLING

INCORPORATION BY REFERENCE

This present disclosure claims the benefit of U.S. Provisional Application No. 63/137,441, filed on Jan. 14, 2021, the entire content of which is incorporated herein by reference in its entirety.

FIELD OF THE INVENTION

This disclosure relates to semiconductor device use and fabrication. This disclosure also relates to a cooling structure for semiconductor devices.

BACKGROUND

More data has been created in the last two years than ever before in human history. Big data does not come close to represent the true scale of it. With today's average of 50 Mbps connection speed, it would take 180 million years to download all the data from the internet. This astronomically colossal data need is driving the semiconductor industry more than ever.

With society marching towards an exponential proliferation of semiconductor devices everywhere for all aspects of our life, what used to be mainly a concern for battery life in portable electronics is becoming a civilization sustainability challenge. Indeed, all these devices are consuming a huge amount of energy across the world. Data centers alone already consume 1% of global energy use, about 18 million US homes, with a carbon footprint already equal or larger than the airline industry, and data center construction is on the rise. Even 1% of total electricity use is huge, but it should be noted that the data center energy use has remained flat since 2015 while internet traffic and data center workloads have more than tripled and doubled respectively. This has been possible thanks to major improvements in computing efficiency from data centers, networks and devices, spanning the IT hardware and semiconductor communities as described by Koomey's law and Moore's law. Meanwhile, it is predicted that, past 2021, these efficiency gains will be unable to keep pace with the exponential growth in demand, especially as new technologies emerge. A few examples include high-resolution video streaming, artificial intelligence, machine learning, blockchain, 5G, and virtual reality computing. Electricity generation and management is becoming a significant concern.

One challenging aspect of electricity generation is that electricity usage should be highly efficient. But operating myriad electronic devices generates significant ineffiencies in the form of thermal waste. Consider data centers as an example. Out of the total energy use of a data center, only 60% of that energy is used for actual computations on average. The remaining 40% is dedicated to cool the electronics to maintain optimum performance and reliability. Indeed, during operation of an electronic device, such as a CPU, part of the energy supplied is converted to heat. Because the heat cannot be extracted instantly, the temperature in the chip rises significantly during sustained operation. Performance of devices such as CMOS transistors linearly degrade with a rise in temperature. Transistors are the main source of the heat, which is known as the transistor self-heating effect. Additionally, sustained and repeated operation at high temperature will lead to premature reliability failures of various parts of the transistors and chip's interconnects.

Modern chips have safety mechanisms that will strongly reduce performance to limit the self-heating and avoid long-term damages. To maintain high performance for non-stop operation of any modern computer, robust and adequate cooling solutions are used. The heat generated in data centers is extreme due to the exceptional density of computers packed together inside the limited volume of a building. Cooling solutions commonly found on personal PCs such as heatsinks and fans are quickly overwhelmed and must be supplemented by extreme measures such as air-cooling the whole building to maintain chip temperature under a limit.

The semiconductor industry has been successful in relentlessly increasing the transistor density generation after generation. That in turn enabled great technological and societal progress, but the state of technology is now at a point where the self-heating effect has become a global primary source of performance cost, environmental cost and financial cost. Most of the solutions currently remain largely inefficient and wasteful as the heatsinks or heat exchangers are either at the package level or at the circuit board level, relatively far from the heat sources. As research is investigating solutions to achieve dense 3D integration for ever-higher transistor volume density, like CFET and Gate-on-Gate stacking, highly efficient and integrated cooling becomes an equally important part of the technology to manage high power densities.

SUMMARY

A first aspect is a method of microfabrication. The method may include forming first devices on a first substrate and second devices on a second substrate; bonding the second substrate to the first substrate using a layer of dielectric bonding material to form a combined substrate, the first substrate being connected to the second substrate with a wiring structure formed within the layer of dielectric bonding material; subsequent to bonding the second substrate to the first substrate, removing the layer of dielectric bonding material such that the first substrate remains connected to the second substrate via the wiring structure; and forming enclosures on the combined substrate, the enclosure defining a circulation path for circulating the dielectric fluid through the wiring structure.

A second aspect is a microfabrication device. The microfabrication device may include a combined substrate including a first substrate connected to a second substrate, the first substrate having first devices and the second substrate having second devices; fluidic passages formed at a connection point between the first substrate and the second substrate, the connection point including a wiring structure that electrically connects first devices to second devices and physically connects the first substrate to the second substrate; dielectric fluid added to the fluidic passages; and a circulating mechanism configured to circulate the dielectric fluid through the fluidic passages to transfer heat.

A third aspect is a microfabrication device. The microfabrication device may include a package structure on a combined substrate; the combined substrate including a first substrate connected to a second substrate, the first substrate having first devices and the second substrate having second devices; first set of fluidic passages formed between the package and the combined structure; second set of fluidic passages formed at a connection point between the first substrate and the second substrate, the connection point including a wiring structure that electrically connects first devices to second devices and physically connects the first substrate to the second substrate; dielectric fluid added to the first set of fluidic passages and the second set of fluidic passages; and a circulating mechanism configured to circulate the dielectric fluid through the first set of fluidic passages and the second set of fluidic passages to transfer heat.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
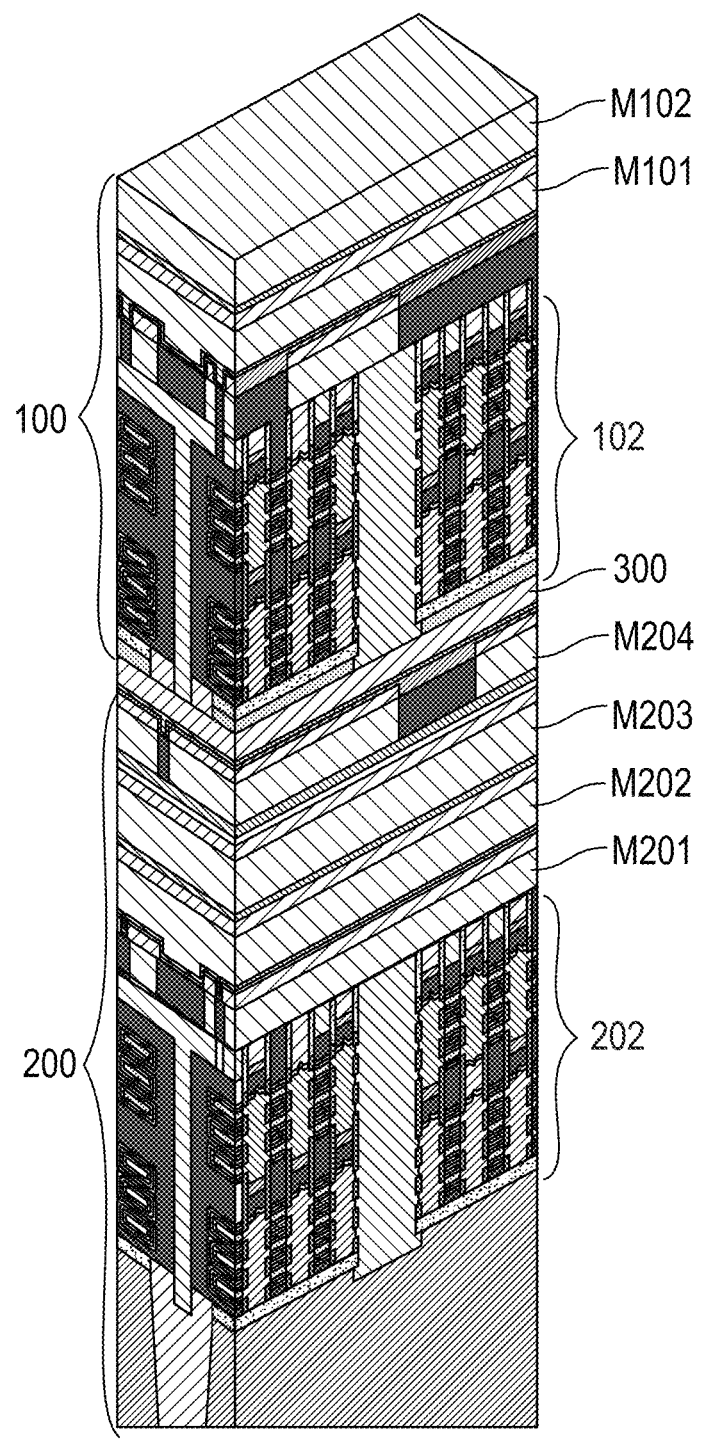
FIG. 1 shows an example structure of GoG (gate-on-gate) stacking achieved by sequential processing and wafer bonding, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Heat removal in highly dense circuits is already a significant problem today, with vast performance and environmental impact. Heat management will become even more critical in the future as data demand exponentially explodes, especially in the prospect of denser 3D integration. Heat removal is therefore becoming an essential pillar of future technology scaling and must be considered from the beginning as part of the integral solution. All current cooling solutions remain largely energy-hungry and inefficient simply because they are far from the billions of nanoscale heat sources induced by the operating transistors. Ironically, at the nanoscale dimensions of modern chips, the distances over which the heat has to diffuse to reach an actual heat exchanger or heatsink are relatively great, leading to significant self-heating.

Techniques herein, however, provide a path for direct heat exchange, very close to the transistors with an extremely high exchange surface area for highly efficient heat removal. While this solution uses some of the chip total area, it opens the way to quasi-instant heat removal, solving many chip and system-level thermal problems, usually leading to reduced performance and user inconveniences. As explained earlier, this quasi-instant heat removal promises even larger gains in the large-scale systems such as data centers. Conventional cooling solutions already are responsible for large thermal restrictions, leading to severe tradeoffs in power density and performance in modern chips. As dense 3D integration such as GoG (gate-on-gate) pushes to largely increase transistor volume density, the invention enables a great reduction of thermal constrains therefore fully leveraging the significant increase of system power density enabled by dense 3D integration.

Techniques herein provide direct heat exchanges by dielectric liquid immersion or flowing through as close as possible to the nanoscale heat sources, the transistors. Nano-fluidic channels herein are built in direct nanoscale proximity of the CMOS transistors, allowing highly efficient heat removal from the hot devices to the dielectric liquid. The possibly room-temperature liquid is injected into the chip by inlets, once the heat is transferred from the devices to the liquid, the hot liquid is then exhausted through outlets. This first cooling circuit is a closed circuit at the transistor level, inside the chip, and then cooled by a secondary heat exchanger located at the chip surface and a secondary cooling circuit located outside the chip, at the package or board level. Circulating the first and second cooling circuits can be facilitated by MEMs micro-pumps, co-located with or integral part of the secondary heat exchanger, or located at the package or board level, respectively. These techniques herein provide nano-fluidic channels of the first cooling circuit at the transistor level inside the chip.

Techniques herein provide a cooling solution for Gate-on-Gate (GoG) stacking architectures to achieve direct heat exchanges by dielectric liquid immersion in close proximity to the nanoscale heat sources, the transistors. While the bottom tier transistors are close to the bulk substrate, offering a good heat escape path, the top tier transistors in GoG stacking are more thermally isolated. Nano-fluidic planes or very wide channels are built in direct nanoscale proximity of the top tier CMOS transistors, just below the transistors, allowing highly efficient heat removal from the hot devices to the dielectric liquid. While the active transistors of the bottom tier are further away from the nano-fluidic channels than the top tier transistors, the nano-fluidic channel is still orders of magnitude closer to the bottom and top active transistors than what a conventional cooling solution at the package level can achieve. Accordingly, the nano-fluidic channel herein functions as a heatsink that is located at nanoscale proximity from the top tier active transistors but also from the bottom tier active transistors.

In one embodiment, liquid is injected into the chip by inlets. After heat is transferred from the devices to the liquid, the heated liquid is then exhausted through outlets. This first cooling circuit is a closed circuit at the transistor level, inside the chip, and then cooled by a secondary heat exchanger located at the chip surface and a secondary cooling circuit located outside the chip, such as at the package or board level. Circulating the first and second cooling circuits can be executed by MEMs micro-pumps, co-located with or integral part of the secondary heat exchanger, or located at the package or board level, respectively. This invention focuses on the nano-fluidic channels of the 1 st cooling circuit at the transistor level inside the chip. Example embodiments will now be described with reference to accompanying drawings. FIG.1 shows an example structure of GoG (gate-on-gate) stacking achieved by sequential processing and wafer bonding. In this example structure, a top tier CFET 102 architecture on a top tier 100 is stacked on top of a bottom tier CFET 202 architecture on a bottom tier 200. CFET 100 on CFET 200 is used only as an example. Accordingly, any mix of transistor architectures can be combined and stacked in this manner such as stacking a finFET (FF) on top of FF, lateral Gate-All-Around on FF, etc. After a bottom tier 200 is completed, for example, from CFET 202, metal layer M201, metal layer M202, metal layer M203, and metal layer M204, a second unprocessed Si wafer can be bonded to the bottom tier 200 (bottom tier having fabricated or partially fabricated devices). The top tier 100 including metal layer M101, metal layer M102, and CFET 102 are then processed and completed on the new Si layer of this second wafer. As shown in FIG. 1, this sequential process results in the presence of a bonding oxide 300 located between each tier and throughout the entirety of the wafer area. As an example, the bonding oxide 300 can be 20-200 nm thick.

Figure 2:
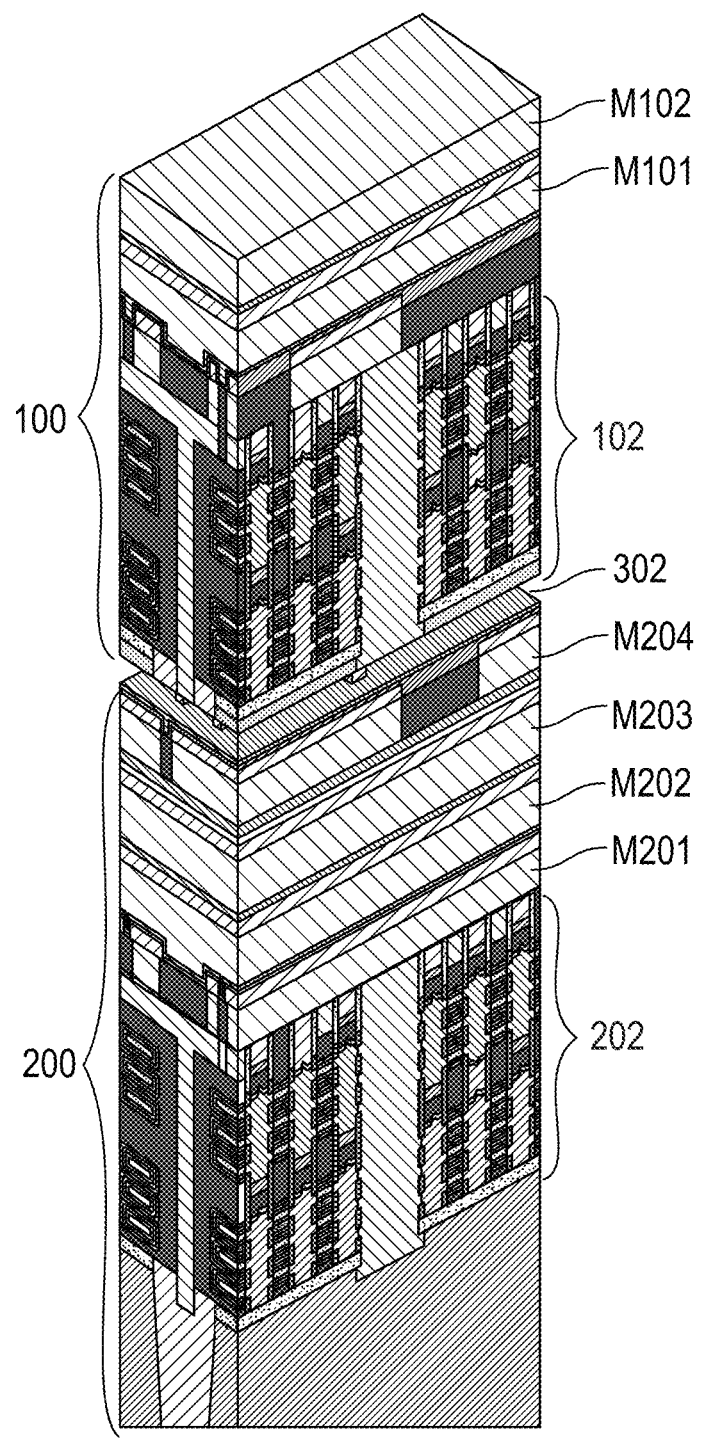
FIG. 2 shows a process of converting an oxide layer into nano-fluidic channels in the example structure of GoG, in accordance with embodiments of the disclosure.

Techniques herein leverage this oxide layer 300 and convert it to very wide nano-fluidic channels 302 located directly below all active transistors of the top tier 100, to enable efficient heat removal from the active transistors, as can be seen in FIG. 2.

Figure 3A:
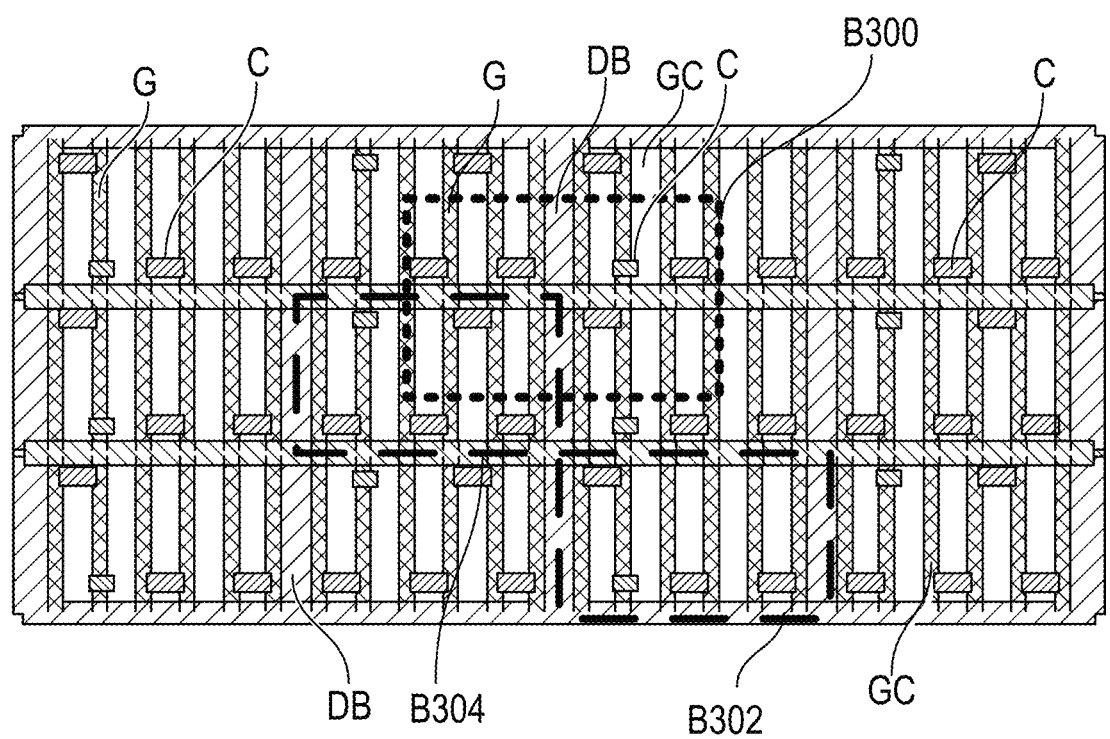
FIGS. 3A and 3B show an example top tier, in accordance with exemplary embodiments of the disclosure.
Figure 3B:
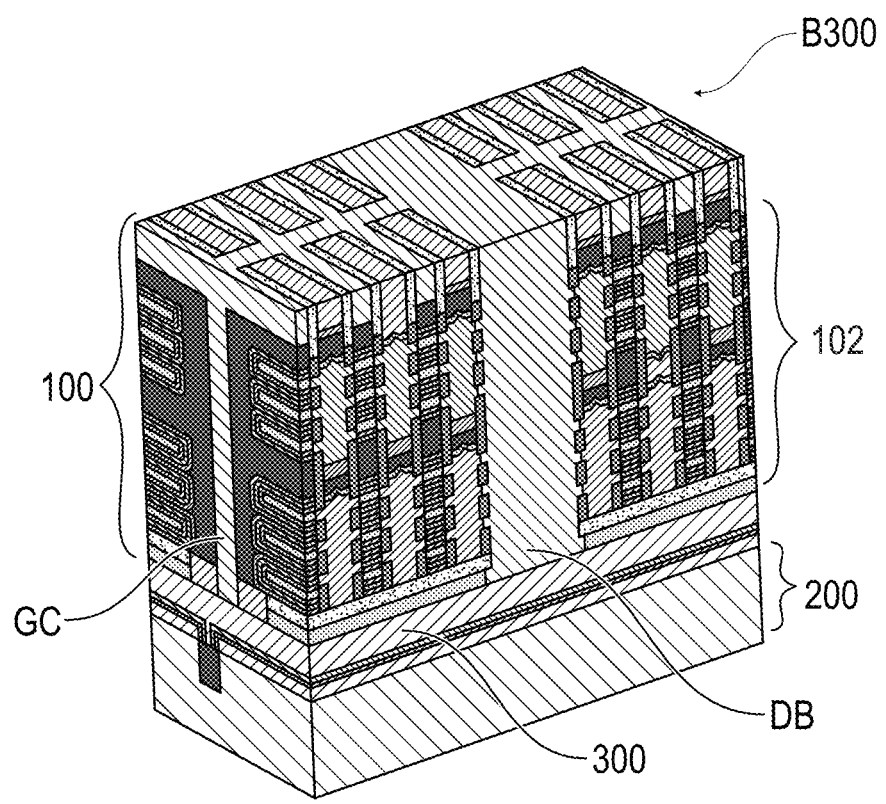

FIGS. 3A and 3B illustrate an example top tier 100.

In FIG. 3A, a layout top-down view of logic standard cells of the top tier 100 placed together in a chip design is shown. The dashed lines B302 and B304 indicate the boundaries of an individual cell. Within a row, cell separation is achieved by diffusion break DB areas in this logic design. In FIG. 3A, gate cut GC, gate G, contact C structures are also shown periodically.

In FIG. 3B, a perspective view of the structure defined by the dotted line B300 in the layout view is illustrated. Centered on the diffusion break DB, and focusing on the top tier 100, only the very top of the bottom tier 200 is represented. As illustrated on the 3D view in FIG. 3B, these diffusion breaks DB provide direct access to the bonding oxide 300. The diffusion breaks DB can be single or double diffusion breaks as is known in the art.

Figure 4A:
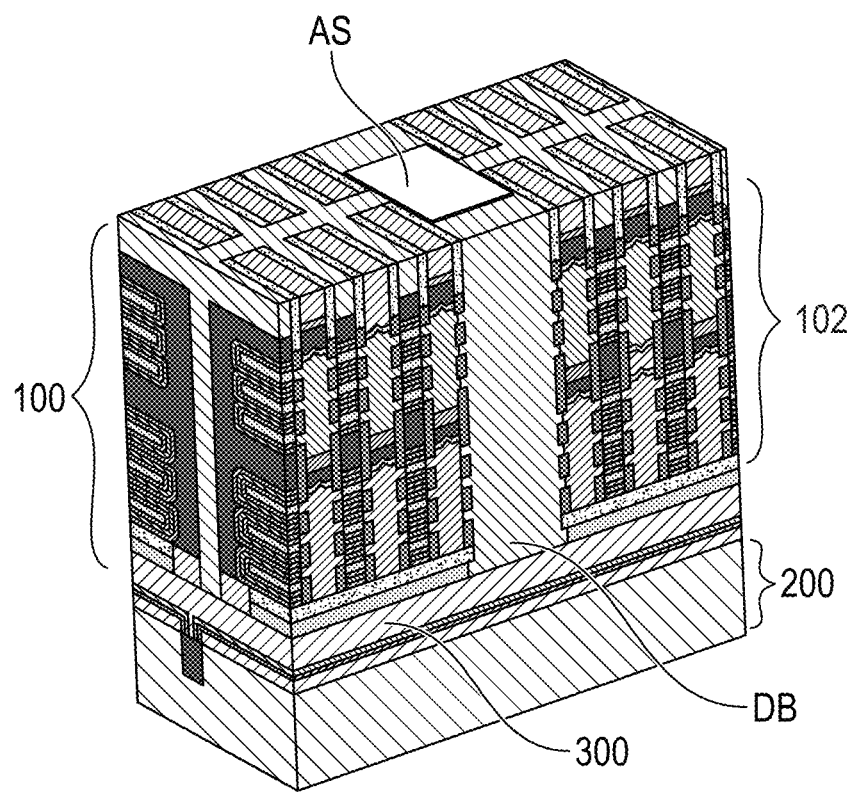
FIGS. 4A-4E show an example flow to create relatively wide nano-fluidic channels, in accordance with exemplary embodiments of the disclosure.
Figure 4B:
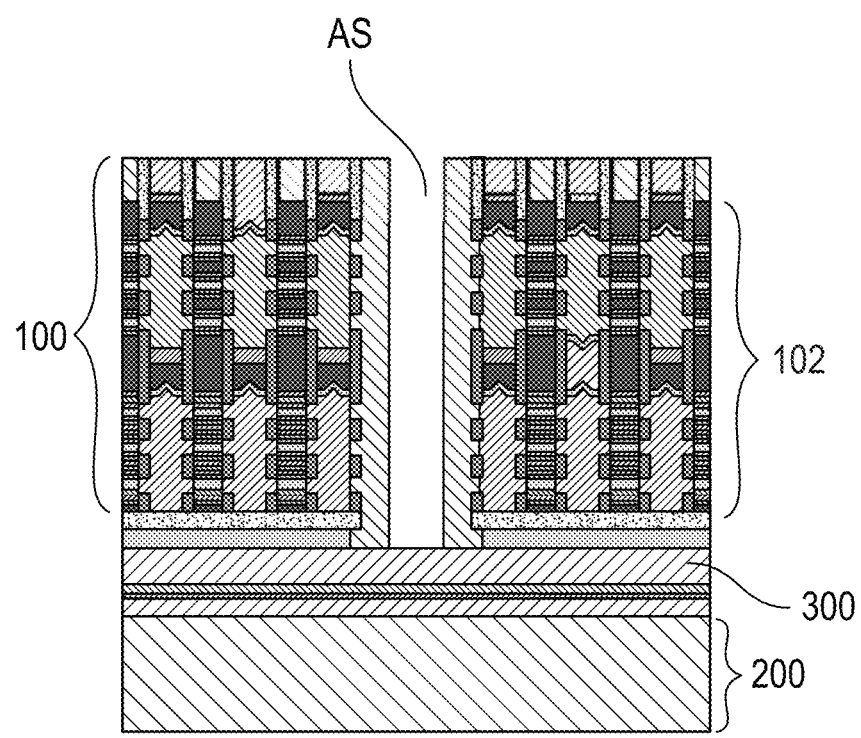

Once the integration flow of the top tier 100 is completed through the formation of the diffusion break DBs, access shafts AS across the chip can be patterned and etched inside the diffusion breaks DB to open access to the bonding oxide 300 as illustrated in FIGS. 4A and 4B. The bonding oxide 300 is then selectively removed (e.g., wet etch, isotropic plasma etch, etc.), leaving super wide nano-fluidic channels 302 directly below the active transistors of the top tier 100. Finally, a low-conformity dielectric deposition (e.g., SiN) followed by a conventional planarization step closes off the access shafts AS without filling the space below, effectively sealing the nano-fluidic channels 302. Subsequently, a conventional BEOL (back end of line) flow may resume.

Figure 4C:
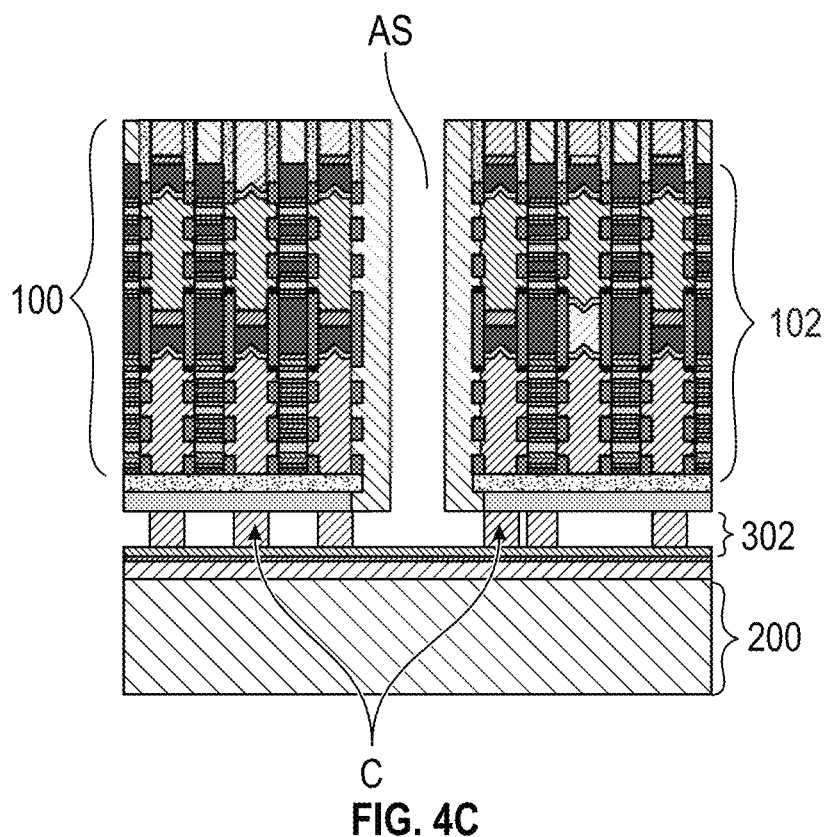
Figure 4D:
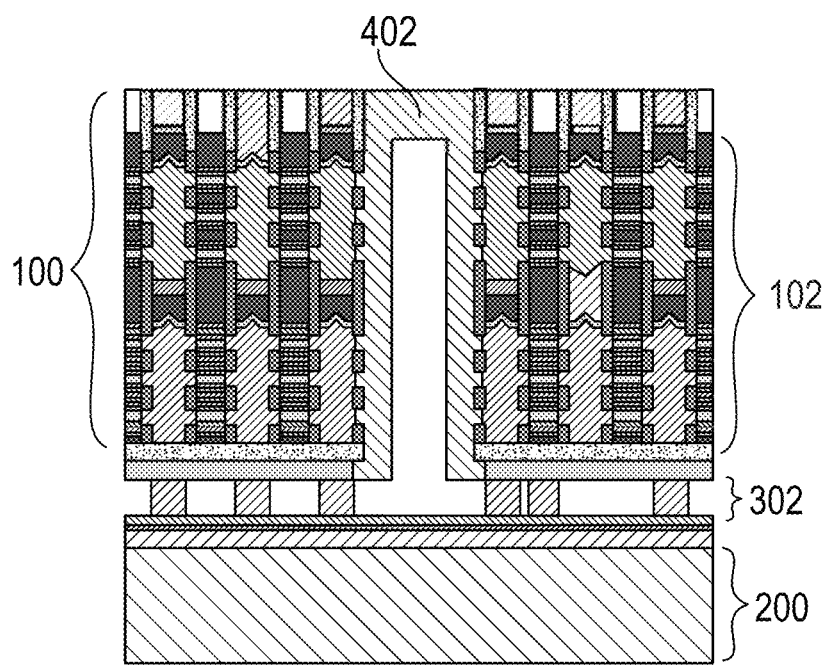
Figure 4E:
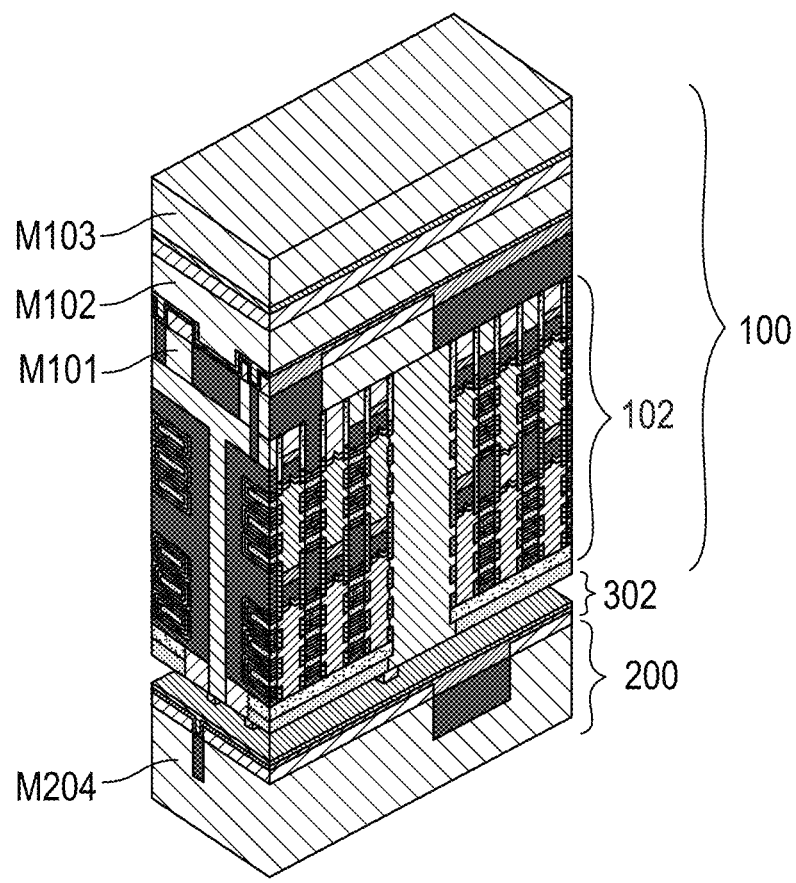

FIGS. 4B-4D illustrate an example flow to create relatively wide nano-fluidic channels 302. Areas for access shafts AS are identified and/or designed as part of a chip in FIG. 4B and FIG. 4C. An etch mask may be formed to etch material at access shaft AS locations until uncovering a layer of bonding oxide 300. The bonding oxide 300 may then be removed. After the bonding oxide 300 is selectively removed, the metal contacts C between the bottom tier 200 and top tier 100, are revealed (or remain) providing mechanical support to the top tier 100 and nano-fluidic channels 302 may be created as shown in FIG. 4C. The access shafts AS can then be covered or closed by an oxide layer 402 on top of the access shaft AS as shown in FIG. 4D. The width of the access shaft AS may be between 10 and 15 nm. The layout view in FIG. 3A shows that these metal contacts C form a sufficiently regular and dense grid. Note that in areas without access shafts AS, the bonding oxide 300 will remain providing additional mechanical support. The illustration in FIG. 4E shows the completed top tier 100 structure with the nano-fluidic channels 302.

Figure 5A:
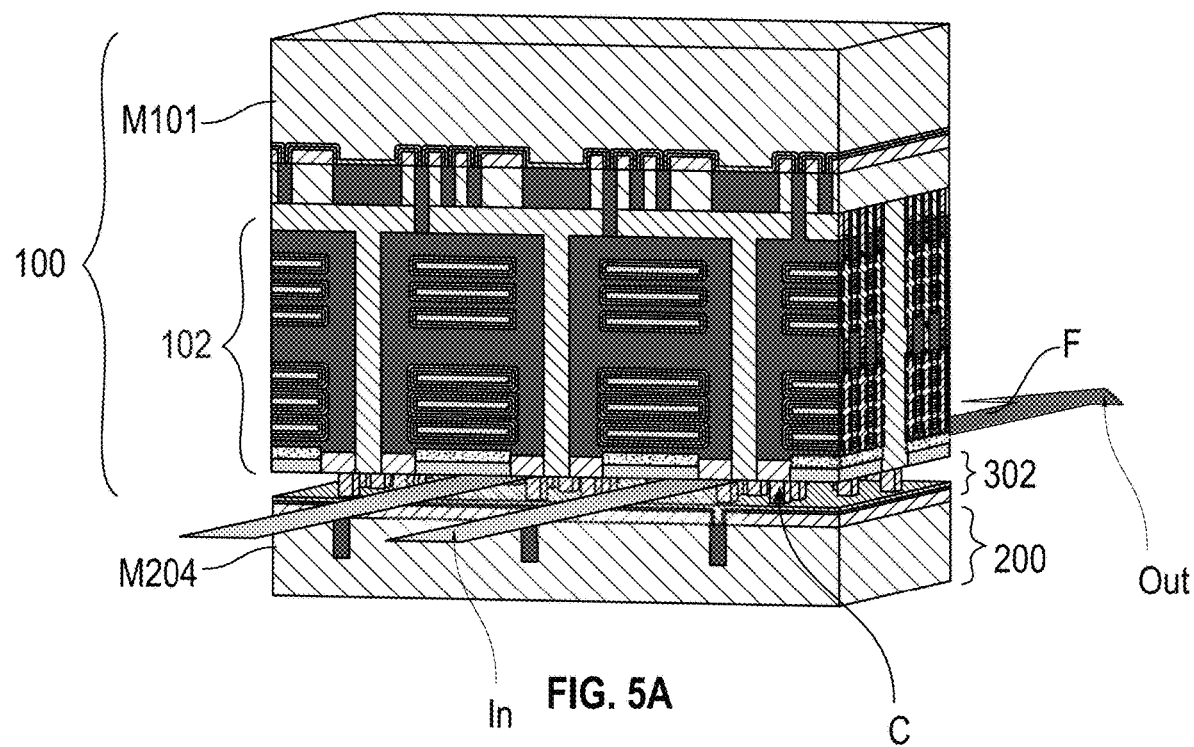
FIGS. 5A-5B show different views to illustrate the flow of the dielectric liquid through the nano-fluidic channels, in accordance with exemplary embodiments of the disclosure.
Figure 5B:
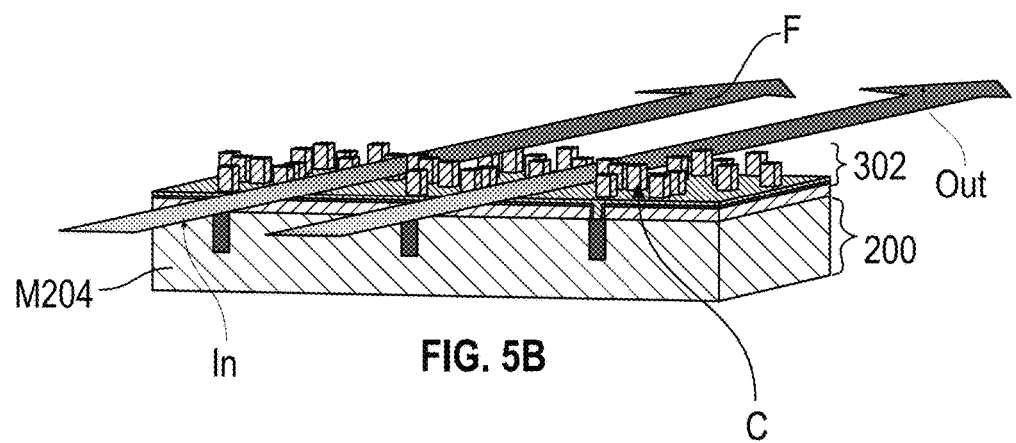

FIGS. 5A and 5B provide different views to illustrate the flow of the dielectric liquid through the nano-fluidic channels 302. By removing the bonding oxide 300, it can be seen that the multiplicity of nano-fluidic channels 302 are naturally connected together to form a super wide channel with a relatively regular grid of metal contacts C. The top tier 100 is then held in place by contacts C that connect the top tier 100 to the bottom tier 200. As an example, the width of nano fluidic channels 302 herein can vary from 50*nm* to the full width of logic blocks, that is, hundreds of microns. While the flow of the dielectric liquid F is shown going in one particular direction, it should be noted that flow can also be in the orthogonal direction. As shown in FIG. 5A and FIG. 5B, cool fluid (light gray) flows into the nano-fluidic channels 302 from inlets to perform heat transfer in the nano-fluidic channels 302, and then the hot fluid (dark gray) after the heat transfer flows out from the outlets. Note that the top tier is removed only for visualization purposes in FIG. 5B.

Figure 6A:
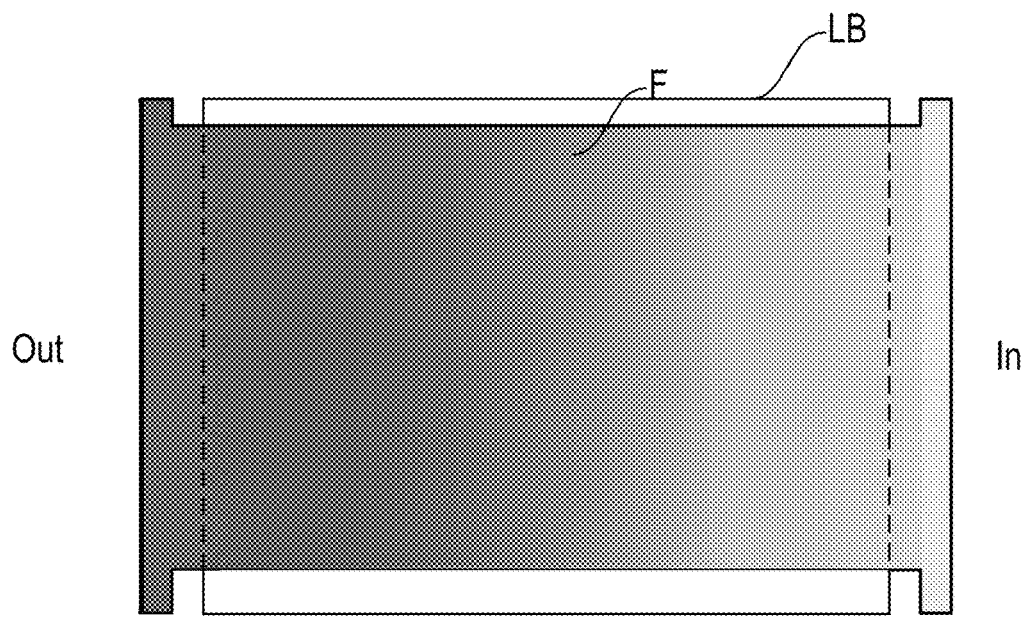
FIG. 6A shows a top view of a first cooling circuit at a transistor level across a logic design block, in accordance with exemplary embodiments of the disclosure.
Figure 6B:
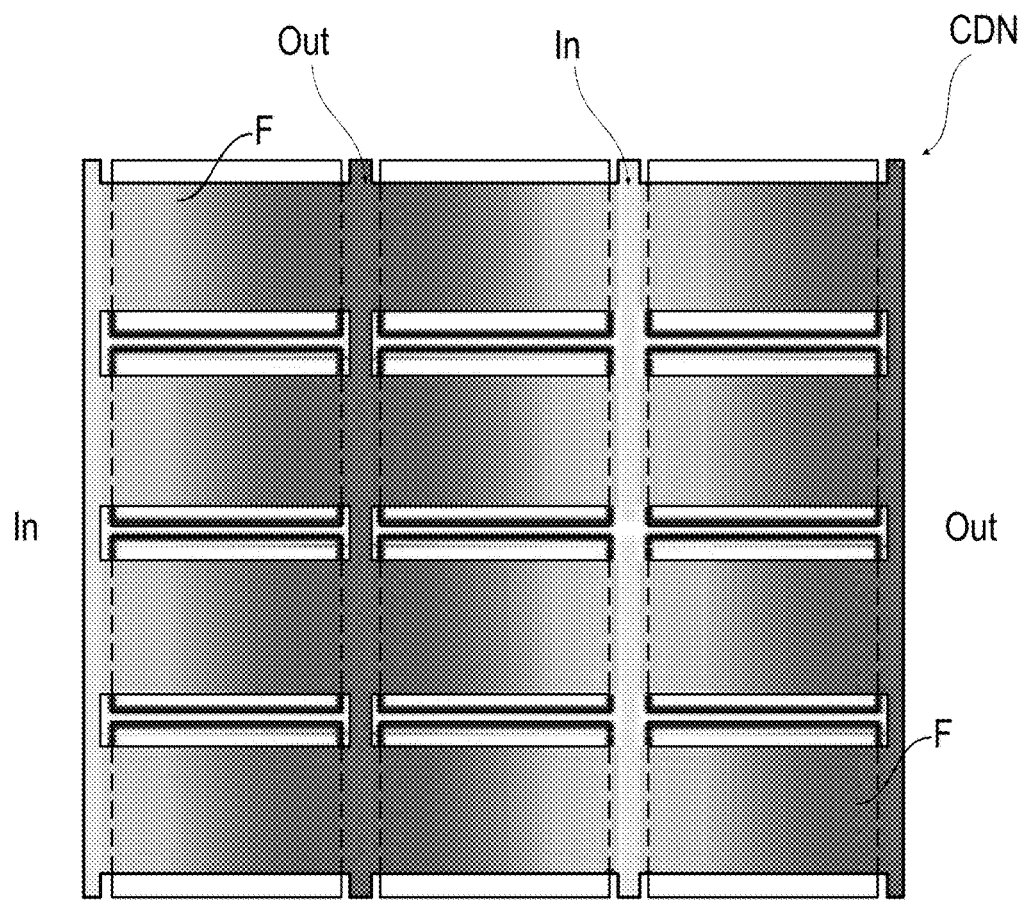
FIG. 6B shows a top view of a first cooling circuit at a chip level, in accordance with exemplary embodiments of the disclosure.
Figure 7:
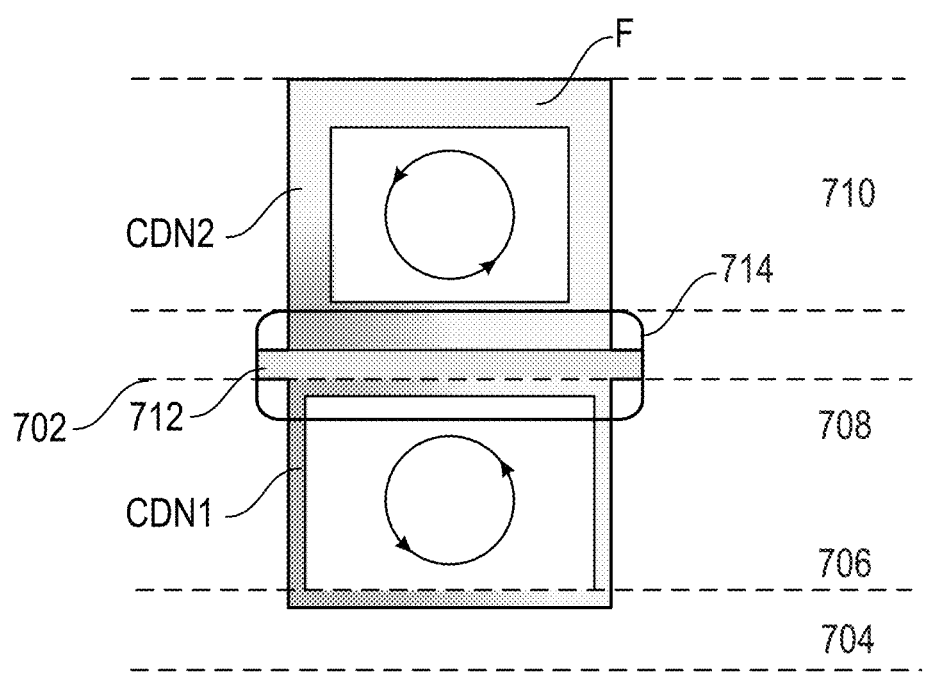
FIG. 7 shows high-level details on a front side of the chip at the system level, including packaging, in accordance with exemplary embodiments of the disclosure.

FIG. 6A shows a top view of a first cooling circuit at a transistor level across a logic design block LB. FIG. 6B shows how the nano-fluidic channels connect together to form a super wide nano-fluidic channel, or plane, inside a logic block, covering the full area of the logic block. Such a wide area coverage located at nanoscale directly below the top tier active transistors and above the bottom tier active transistors ensures maximum heat removal and cooling efficiency. As shown in FIG. 6A and FIG. 6B, cool fluid (light gray) flows into the nano-fluidic channels from inlets to perform heat transfer in the nano-fluidic channels, and then the hot fluid (dark gray) after the heat transfer flows out from the outlets, forming a CDN FIG. 7 provides high-level details on a cross-section of the chip at the system level, including packaging, on how embodiments herein can be used in connection with other constructs and inventions.

As mentioned earlier, in FIG. 6A, each side of the nano-fluidic plane is connected to wider inlet and outlet channels at the block boundaries. Taking another step back at larger scale, FIG. 6B, showing a full chip or large design block, illustrates how block inlets and outlets can connect together, forming a cooling distributed network CDN. Finally, FIG. 7 shows a cross-sectional view at the package level 710. The cross-section view shows how the block inlets and outlets of the primary CDN CDN1 or cooling circuit extend all the way from the transistor level 706 at the bottom of the top tier to the top BEOL layer on the top of the chip level 708, forming a closed circuit. A secondary CDN CDN2 located in the package level 710 can be formed and used to remove the heat from the primary CDN CDN1, enabled by a heat exchanger 714 placed at the chip to package interface 702 with a typical large heatsink 712. As noted previously, the transistor level 704 of the bottom tier is not in direct proximity to CDN1, it is still close enough so its heat can be extracted by CDN1. As mentioned earlier in FIGS. 5A, 5B, 6A, and 6B, cool fluid (light gray) flows into the nano-fluidic channels from inlets and the hot fluid (dark gray) flows out from the outlets in CDN1 and CDN2.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, the method comprising:
forming first devices on a first substrate and second devices on a second substrate;
bonding the second substrate to the first substrate using a layer of dielectric bonding material to form a combined substrate, the first substrate being connected to the second substrate with a wiring structure formed within the layer of dielectric bonding material;
subsequent to bonding the second substrate to the first substrate, removing the layer of dielectric bonding material such that the first substrate remains connected to the second substrate via the wiring structure; and
forming enclosures on the combined substrate, the enclosure defining a circulation path for circulating a dielectric fluid through the wiring structure.

2. The method of claim 1, further comprising forming a circulating mechanism to circulate the dielectric fluid through the wiring structure.

3. The method of claim 1, wherein the layer of the dielectric bonding material is silicon oxide or silicon nitride.

4. The method of claim 1, wherein the first substrate and the second substrate include one or more diffusion breaks.

5. The method of claim 4, wherein one or more access shafts are formed in the one or more diffusion breaks.

6. The method of claim 5, wherein removing the layer of dielectric bonding materials includes etching the layer of dielectric bonding materials through the one or more access shafts.

7. The method of claim 6, further comprising closing the one or more access shafts after removing the layer of dielectric bonding materials.

8. A microfabrication device comprising:
a combined substrate including a first substrate connected to a second substrate, the first substrate having first devices and the second substrate having second devices;
fluidic passages formed at a connection point between the first substrate and the second substrate, the connection point including a wiring structure that electrically connects first devices to second devices and physically connects the first substrate to the second substrate;
dielectric fluid added to the fluidic passages; and
a circulating mechanism configured to circulate the dielectric fluid through the fluidic passages to transfer heat.

9. The microfabrication device of claim 8, wherein the formation of the fluidic passages includes removing a layer of dielectric bonding material, the dielectric bonding material being silicon oxide or silicon nitride.

10. The microfabrication device of claim 9, wherein removing the layer of dielectric bonding materials includes etching the layer of dielectric bonding materials through one or more access shafts.

11. The microfabrication device of claim 10, where the formation of the fluidic passages further includes closing the one or more access shafts after removing the layer of dielectric bonding materials.

12. The microfabrication device of claim 8, wherein the first substrate and the second substrate include one or more diffusion breaks.

13. The microfabrication device of claim 12, wherein one or more access shafts are formed in the one or more diffusion breaks.

14. A microfabrication device comprising:
a package structure on a combined substrate;
the combined substrate including a first substrate connected to a second substrate, the first substrate having first devices and the second substrate having second devices;
first set of fluidic passages formed between the package and the combined structure;
second set of fluidic passages formed at a connection point between the first substrate and the second substrate, the connection point including a wiring structure that electrically connects first devices to second devices and physically connects the first substrate to the second substrate;
dielectric fluid added to the first set of fluidic passages and the second set of fluidic passages; and
a circulating mechanism configured to circulate the dielectric fluid through the first set of fluidic passages and the second set of fluidic passages to transfer heat.

* * * * *

UNITED STATES PATENT AND TRADEMARK OFFICE
CERTIFICATE OF CORRECTION

| | |
|---|---|
| PATENT NO. | : 11,581,242 B2 |
| APPLICATION NO. | : 17/344259 |
| DATED | : February 14, 2023 |
| INVENTOR(S) | : Chanemougame et al. |

It is certified that error appears in the above-identified patent and that said Letters Patent is hereby corrected as shown below:

On the Title Page

Column 1, Item (72), in "Inventors", Line 3, delete "Mechanicsville," and insert -- Mechanicville, --, therefor.

Signed and Sealed this
Seventeenth Day of October, 2023

Katherine Kelly Vidal
*Director of the United States Patent and Trademark Office*